(12) United States Patent
Tagawa

(10) Patent No.: US 6,572,205 B2
(45) Date of Patent: Jun. 3, 2003

(54) ELECTRONIC DEVICE CABINET AND ELECTRONIC DEVICE

(75) Inventor: Kazusato Tagawa, Sodegaura (JP)

(73) Assignee: Sony Computer Entertainment Inc., Tokyo (JP)

( * ) Notice: Subject to any disclaimer, the term of this patent is extended or adjusted under 35 U.S.C. 154(b) by 24 days.

(21) Appl. No.: 09/848,680

(22) Filed: May 3, 2001

(65) Prior Publication Data

US 2002/0008447 A1 Jan. 24, 2002

(30) Foreign Application Priority Data

May 9, 2000 (JP) ........................................ 2000-135782
Oct. 3, 2000 (JP) ........................................ 2000-303911
Apr. 25, 2001 (JP) ........................................ 2001-127843

(51) Int. Cl.[7] ................................................ H05K 5/00
(52) U.S. Cl. .................... 312/223.1; 292/169; 292/170
(58) Field of Search .............................. 292/170, 169, 292/140; 312/223.2, 223.1, 327, 328, 222, 215; 369/291; 360/133

(56) References Cited

U.S. PATENT DOCUMENTS

| 122,061 | A | * | 12/1871 | Robie ........................ 292/170 |
| 4,815,066 | A | | 3/1989 | Horvath |
| D320,789 | S | * | 10/1991 | Sogabe ........................ D14/136 |
| 5,062,671 | A | | 11/1991 | Goetz et al. |
| 5,555,157 | A | * | 9/1996 | Moller et al. ............. 312/223.2 |
| 5,626,374 | A | | 5/1997 | Kim |
| 5,793,742 | A | * | 8/1998 | Sandell et al. ............... 250/306 |
| 6,067,225 | A | * | 5/2000 | Reznikov et al. ........ 312/223.2 |
| D430,862 | S | * | 9/2000 | Honjo ........................ D14/156 |
| 6,118,757 | A | * | 9/2000 | Olsen et al. ................. 369/291 |
| D438,853 | S | * | 3/2001 | Iino ........................... D14/136 |

FOREIGN PATENT DOCUMENTS

| FR | 2 266 031 | | 3/1999 |
| GB | 2 242 475 A | | 10/1991 |
| TW | 386638 | | 4/2000 |

* cited by examiner

Primary Examiner—Janet M. Wilkens
(74) Attorney, Agent, or Firm—Katten Muchin Zavis Rosenman

(57) ABSTRACT

An electronic device cabinet for an electronic device is provided with a cover and an engaging member that holds the cover in a closed state. The engaging member has an integrally formed impelling member that acts upon the engaging member and furthers the interengagement with said cover. The integrally formed engagement member and impelling member can be attached to the cabinet in a simple maneuver, thereby simplifying the overall assembly of the electronic device cabinet.

22 Claims, 7 Drawing Sheets

ELECTRONIC DEVICE CABINET AND ELECTRONIC DEVICE

FIELD OF THE INVENTION

This invention concerns an electronic device cabinet having a main body and a cover that is rotatably attached to the cabinet main body, and in particular, an engagement member having a simplified construction for engaging said cover and for controlling the open and closed state of said cover.

BACKGROUND OF THE INVENTION

Heretofore known as cabinets for entertainment devices that employ optical disks, such as CD players, DVD players and the like, are cabinets that have a cover whose end is attached rotatably to a cabinet main body and in which the cover is opened and closed using elastic force. Such a cabinet is usually constructed in such a way that the cover is attached rotatably to the inner side of the cabinet main body by a hinge or other mechanism, a spring or other impelling means is provided inside the cabinet main body, and the cover is opened by releasing the elastic force of the spring. Provided on the cabinet main body in a location away from the attachment of the cover is usually an engaging member that advances and retracts with respect to the cover, and the cover can be closed by engaging the end of the cover with this engaging member. This engaging member usually has a sloping surface that comes into contact with a button or other pressing member, and when the operator presses the button, the pressing force acts via the sloping surface as a force in the advance-and-retract direction of the engaging member, and it moves away from the cover end. When the operator releases his hand from the button, it is necessary to restore the engaging member to its original position and engage the cover with the engaging member, so a spring or other impelling means is provided on the advance-and-retract direction base end part of the engaging member.

However, in such a conventional electronic device cabinet the engagement structure of the cover consists of a button, engaging member, and impelling means, with a large number of parts, which creates the problem that much work is required during assembly, and it is difficult to assemble the electronic device efficiently. Thus, during assembly a spring or other impelling means must be mounted on the base end part of the engaging member in a bent state, which complicates the assembly operation.

OBJECTS OF THE INVENTION

It is an object of the present invention, therefore, to provide an electronic device cabinet and an electronic device having a reduced assembly operation.

It is a further object of the present invention to provide an electronic device cabinet and an electronic device having an engagement member for engaging the cover of the cabinet and for controlling the open and closed state of the cover.

It is a further object of the present invention to provide an electronic device cabinet and an electronic device having an engagement member with an impelling means that is formed integrally with the engagement member.

It is a further object of the present invention to provide an electronic device cabinet and an electronic device having an engagement member with an impelling means that can be withdrawn from and inserted into the electronic device cabinet in a simple operation.

Still other objects and advantages of the invention will become clear upon review of the following detailed description in conjunction with the appended drawings.

SUMMARY OF THE INVENTION

An electronic device cabinet having a cabinet main body and a cover whose end is attached rotatably to the cabinet main body, is provided with an engaging member that advances and retracts with respect to the end of said cover and holds said cover in closed state by engaging said end of said cover. The engaging member has an engaging part main body that engages the end of said cover and an impelling means that impels this main body in the advance-and-retract direction, both the engaging part main body and the impelling means being formed integrally. Because of such integrated construction, the engaging part main body and the impelling means can be attached just by fitting the engaging member onto the cabinet main body, which greatly simplifies the assembly operation. Such cabinet can be used is an entertainment device such as a CD or DVD player or a game device, and using the construction of the present invention on these electronic devices can simplify the structure of the cabinet, which is desirable in making electronic devices smaller and lighter, and in reducing their cost. It is desirable that the impelling means have a symmetric construction for attributing a uniform force on said engagement member, and be formed in the shape of a ring. It is also desirable that a guide is provided on said cabinet main body for regulating the movement of the engaging part main body. It is also desirable to constitute said engaging member as an integral molding of injection-molded polyacetal, because polyacetal is a good sliding material and has good fatigue resistance.

It is also desirable that there be formed in said cabinet main body an opening into which the cover is press-fitted, and that there be provided on the circumferential edge of this opening a depression outside of which the circumferential edge of said cover is exposed in the state in which the cover is press-fitted into said opening.

It is also desirable that said cabinet main body have a pair of accommodation members or cabinet halves that, by engaging with each other, accommodate inside them a device main body that has electronic components, etc., that there be formed in the cabinet main body an opening part that exposes connection terminals for external device connection that are provided on said device main body, and that this opening part straddle the boundary part of the pair of accommodation members.

Here, the connection terminals for external device connection might include, but are not limited to, for example, controller connectors (terminals) to which controllers are connected and audio and video output terminals for outputting signals from the device main body to a television receiver, as well as power supply terminals, etc. for supplying electric power to the device main body from an external power source.

Also, the opening part that straddles the boundary part (engagement line) of the pair of accommodation members might include but not be limited to, for example, an opening part that consists of openings formed in each of the pair of accommodation members facing the boundary part, as well as an opening part, etc. that consists of an opening formed in one or the other of the pair of accommodation members facing the boundary part.

Thus, the pair of accommodation members that constitute the cabinet main body is normally formed by injection molding using a metal mold that has an upper mold (cavity)

and a lower mold (core). In doing so, if for example one is to form in the accommodation members an opening part that exposes connection terminals provided on the device main body, the accommodation members are formed by (1) engaging the upper and lower molds and inserting into the metal mold a slide core that moves horizontally, (2) injecting resin into the metal mold, (3) moving the slide core and removing it from inside the metal mold, and (4) raising the upper mold and separating the molding from the mold. But this requires additional steps for moving the slide core, which creates the problem of detracting from the productivity of the accommodation members.

Thus if an opening part is formed that straddles the boundary part of the pair of accommodation members instead of forming an opening part inside the accommodation members, then it suffices to form in each accommodation member an opening facing the boundary part, which makes a slide core unnecessary, reduces the number of manufacturing steps, and thereby improves the productivity of the accommodation members.

DETAILED DESCRIPTION OF THE PREFERRED EMBODIMENTS

Figure 1:
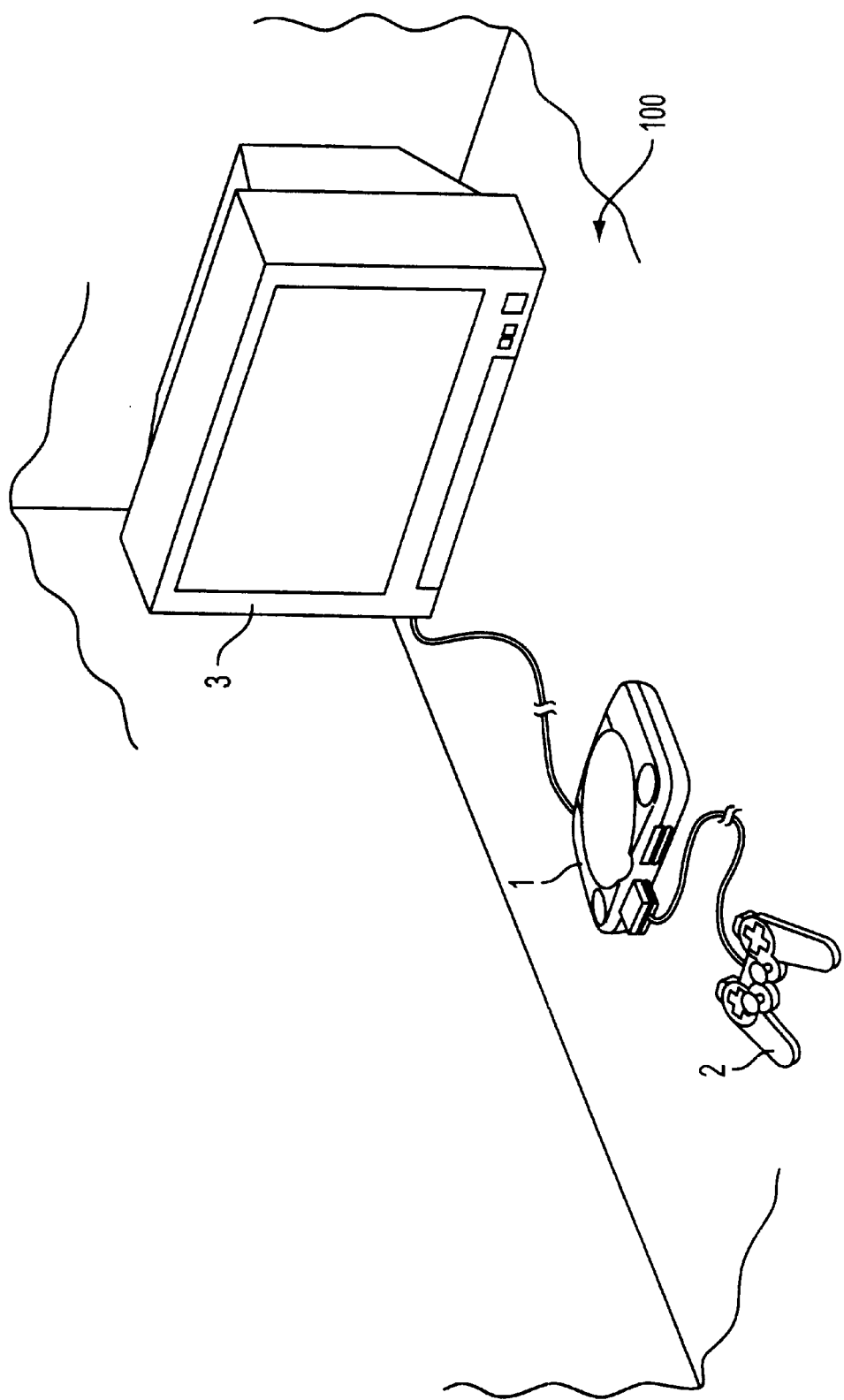
FIG. 1 is a perspective view showing a living room including an electronic device and cabinet of the present invention.

The following detailed description is of the best mode or modes of the invention presently contemplated. Such description is not intended to be understood in a limiting sense, but to be an example of the invention presented solely for illustration thereof, and by reference to which in connection with the following description and the accompanying drawings one skilled in the art may be advised of the advantages and construction of the invention. In the various views of the drawings, like reference characters designate like or similar parts.

FIG. 1 shows part of a living room 100 in which is set up a television receiver 3, which outputs images and sound, etc., an entertainment device 1, which is an electronic device that is connected to this television receiver 3, and a controller 2, which is an operation device that sends instructions to entertainment device 1. Entertainment device 1 for example reads a game program, etc. recorded on an optical disk, etc. and executes it according to instructions from controller 2 operated by the user (game player).

Figure 2:
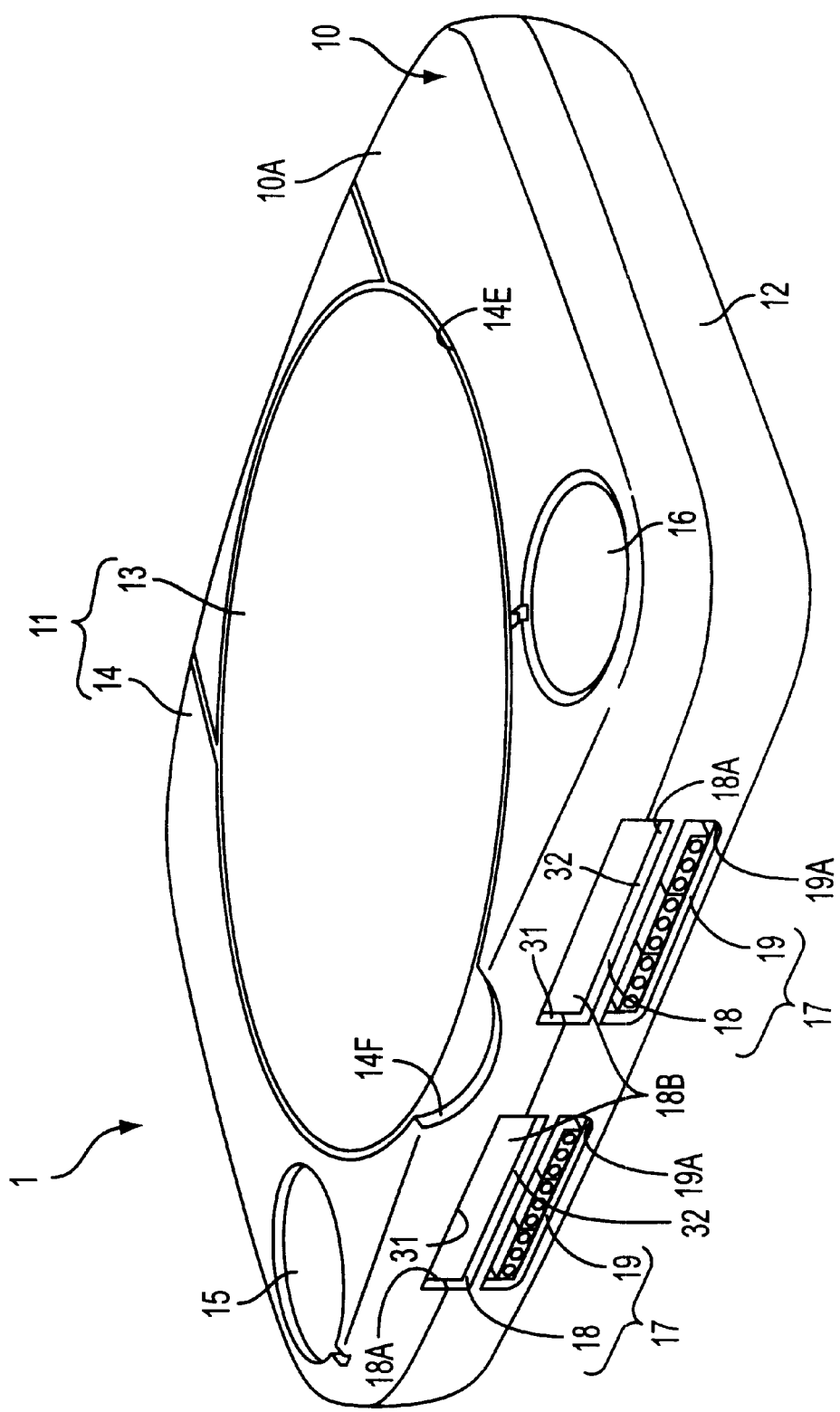
FIG. 2 is a perspective view showing an entertainment device of the present invention.

As shown in FIG. 2, entertainment device 1 comprises a device main body (not pictured), which has electronic parts, etc., and entertainment device cabinet 10, which has cabinet main body 10A, upper case 11 and lower case 12, which accommodate the device main body by engaging together, and it is preferably formed in a flat square shape. Upper case 11 and lower case 12 are preferably formed by injection molding.

Upper case 11 has a flat roughly circular cover 13 provided in the middle and upper case main body 14 provided around this cover 13. Cover 13 is made in such a way that one press-fits it into opening 14E to close said cover 13. Formed on the circumferential edge of opening 14E is depression 14F, where the circumferential edge of said cover 13 is exposed to the outside in the state in which cover 13 is press-fitted into said opening 14E (see FIG. 2). Lower case 12, which covers the device main body from below, is made in such a way that its end engages with the end of upper case main body 14. The part where these ends engage with one another is the boundary part of lower case 12 and upper case 11.

On the left side of cover 13 is power button 15, which is operated when turning the power to the device on or off, and on the right side of cover 13 is open-close button 16, which is operated when opening or closing said cover 13. Two slots 17, which are connection terminals for external device connections, are exposed on the side of cabinet 10 that appears in the front in FIGS. 2 and 3. Each slot 17 has a memory card insertion part 18, which is positioned toward the top, and a controller connection part 19, which is positioned toward the bottom. Memory card insertion part 18 is for inserting a memory card or other external auxiliary memory device, and its insertion hole 18A, which straddles the boundary part (engagement line) of upper case main body 14 (upper case 11) and lower case 12, is preferably formed in a rectangular shape, with its longer direction being horizontal. Provided on this memory card insertion part 18 is cover 18B for protecting the connection terminals provided inside it. Insertion hole 18A is formed by openings 31 and 32, which are formed in upper case main body 14 (upper case 11) and lower case 12, respectively, facing the boundary of upper case main body 14 and lower case 12. Controller connection part 19 is an input-output terminal for the input and output of signals; to which is connected the connection terminal (not shown) formed on the end of a controller cable that extends from controller 2 (see FIG. 1). Insertion hole 19A is preferably formed in a rectangular shape, with its longer direction being horizontal, and is preferably shaped so that its corners at the bottom are rounder than its corners at the top. Shaping insertion hole 19A in this way prevents the connection terminal (not shown) of controller 2 from being connected in the wrong orientation. Also, because the shape of insertion hole 19A is made with a structure that is different from the shape of insertion hole 18A of memory card insertion part 18, there is no danger of mistakenly inserting an external auxiliary memory device into insertion hole 19A of controller connection part 19, and vice versa.

Positioned on the side opposite the side on which these slots 17 are positioned, are a power connector (not shown), to which an AC adaptor (not shown) is connected and which is a power supply terminal supplying electric power from an external power source (not shown) to the device main body, and video and audio output terminals (not shown) for outputting to television receiver 3 video signals, audio signals, and various other signals recorded on an optical disk (not pictured). Also, the opening part (not shown) through which this power source connector and these video and audio output terminals are exposed to the outside is formed, like the aforementioned insertion hole 18A, by an opening formed on lower case 12 facing the boundary of upper case main body 14 and lower case 12.

Figure 3:
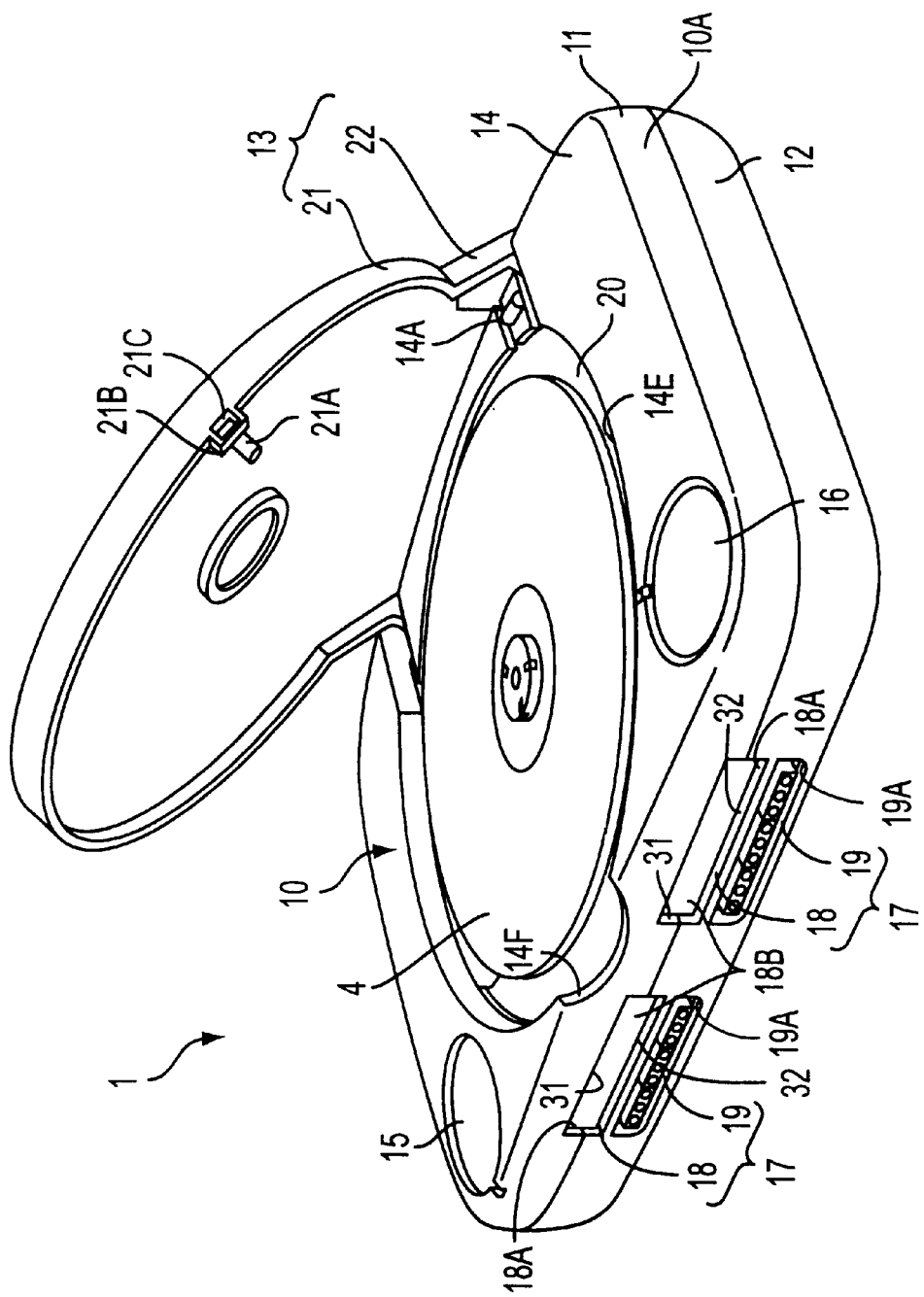
FIG. 3 is a perspective view showing the entertainment device of FIG. 2 with its cover open.

As shown in FIG. 3, cover 13 comprises a roughly flat round disk covering unit 21, which covers disk mounting part 20 onto which optical disk 4 is mounted, and an attachment part 22, which extends from part of the circumferential edge of disk covering unit 21 and whose end is rotatably attached to upper case main body 14 by a hinge mechanism. Provided inside upper case main body 14 is spring 14A, whose one end comes into contact with cover 13; which biases the cover 13 into the open position as shown in FIG. 3.

Provided on part of the circumferential edge of disk covering unit 21 and protruding toward the lower case 12 side is rod-shaped member 21A, which presses an open-closed detection switch (not pictured) that detects whether cover 13 is open or closed, and square-shaped engagement piece 21B, in the middle of which is formed recess 21C. Rod-shaped member 21A and engagement piece 21B are formed on said disk covering unit 21 in a position corresponding to or aligned with the position of open-close button 16.

Figure 4:
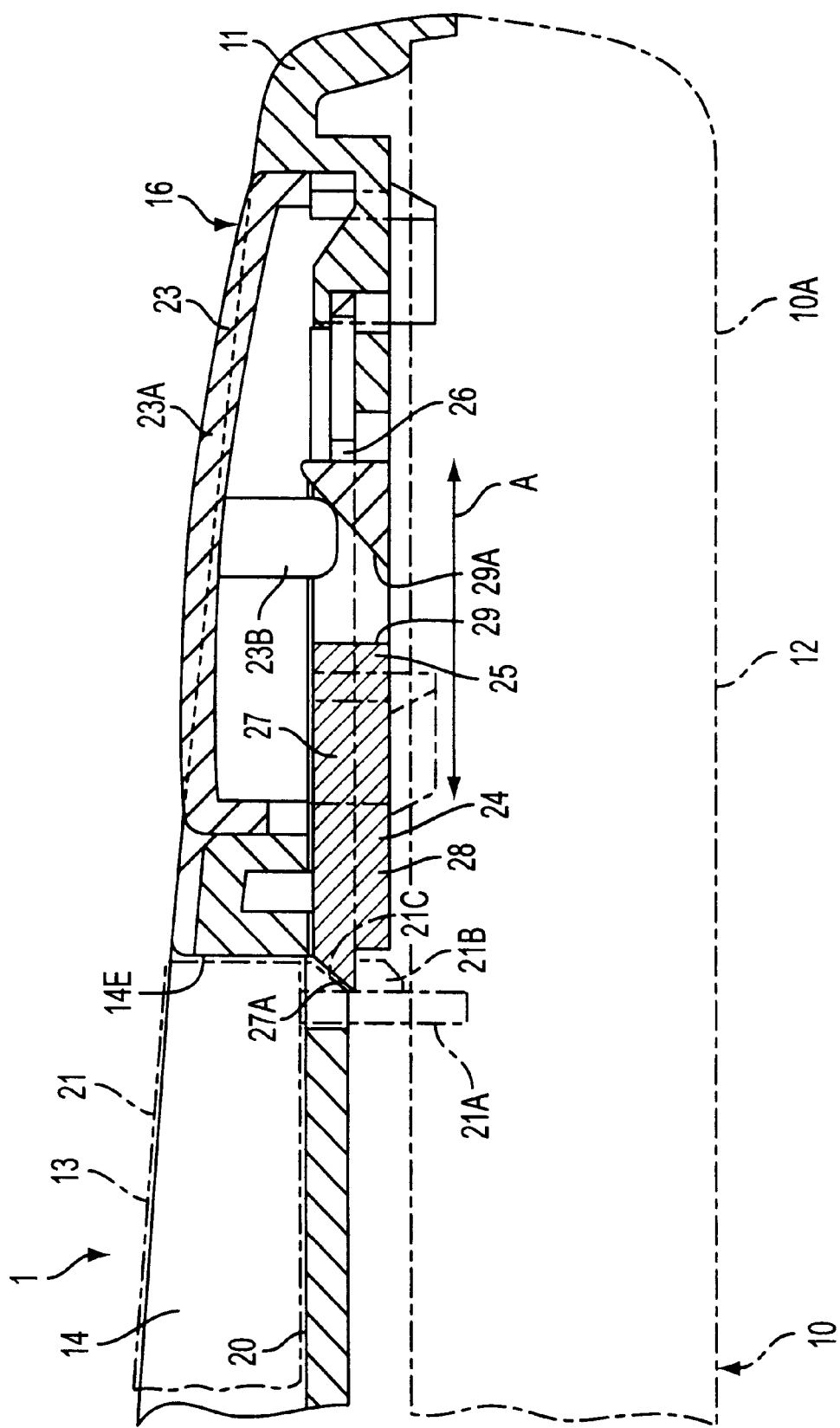
FIG. 4 is a cross-sectional view showing the open-close button portion of said entertainment device of the invention.
Figure 5:
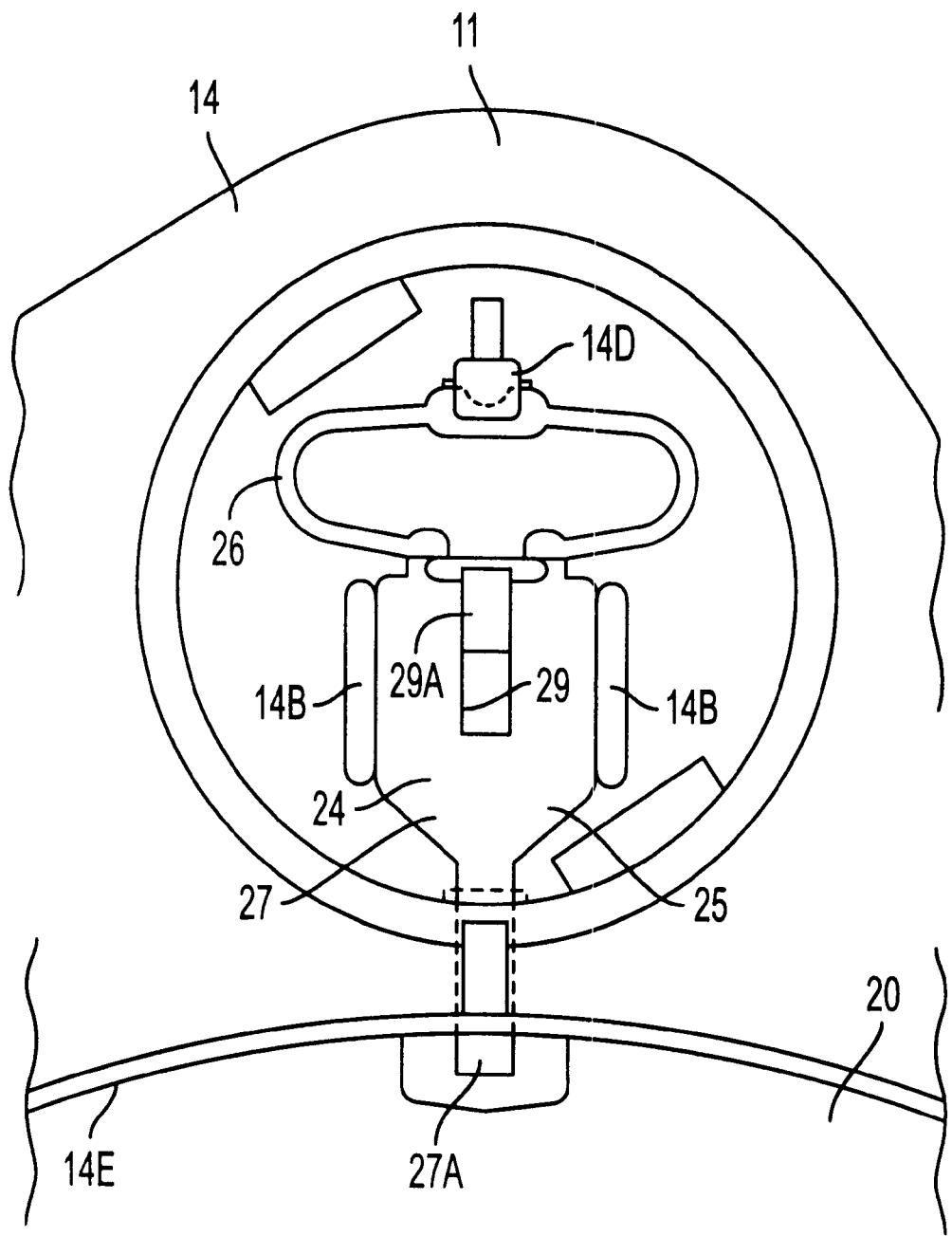
FIG. 5 is a plan view showing the engaging member of the present invention.
Figure 6:
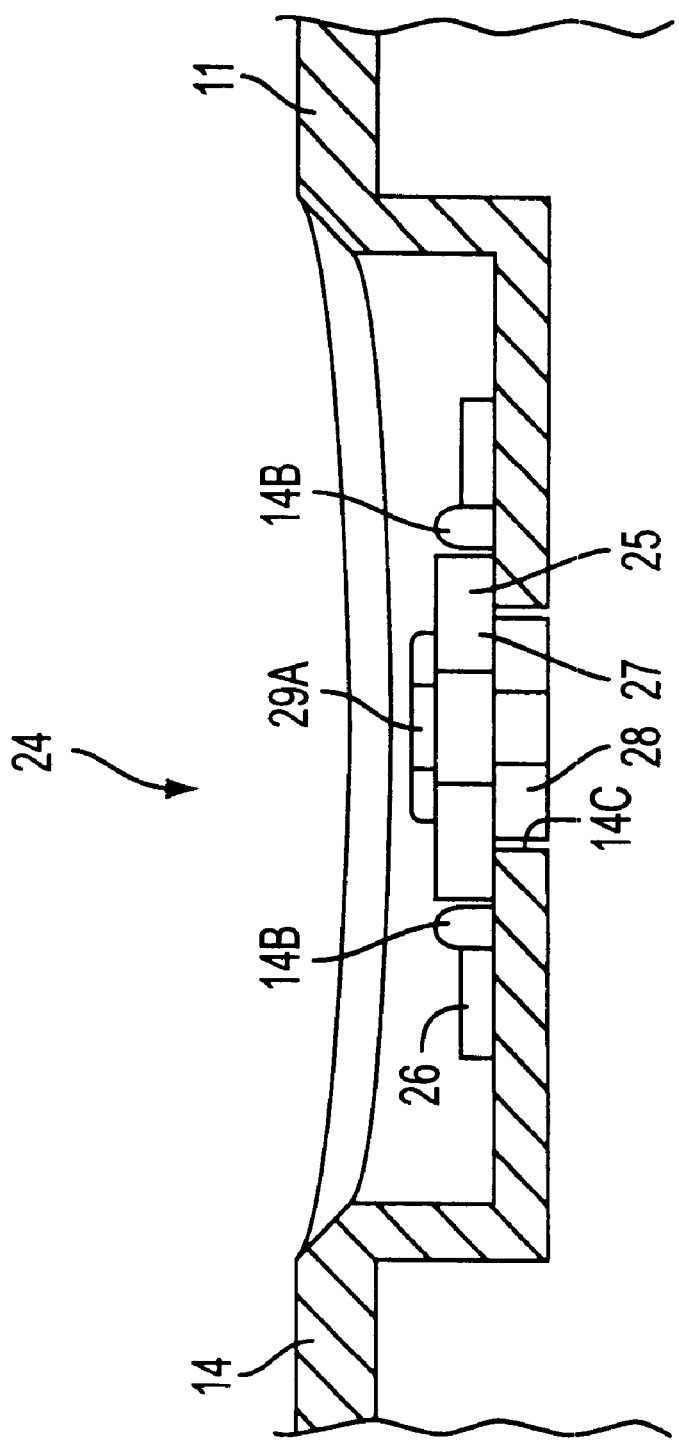
FIG. 6 is a cross-sectional view showing the attachment of the engaging member of the invention with the cabinet main body of the invention.
Figure 7:
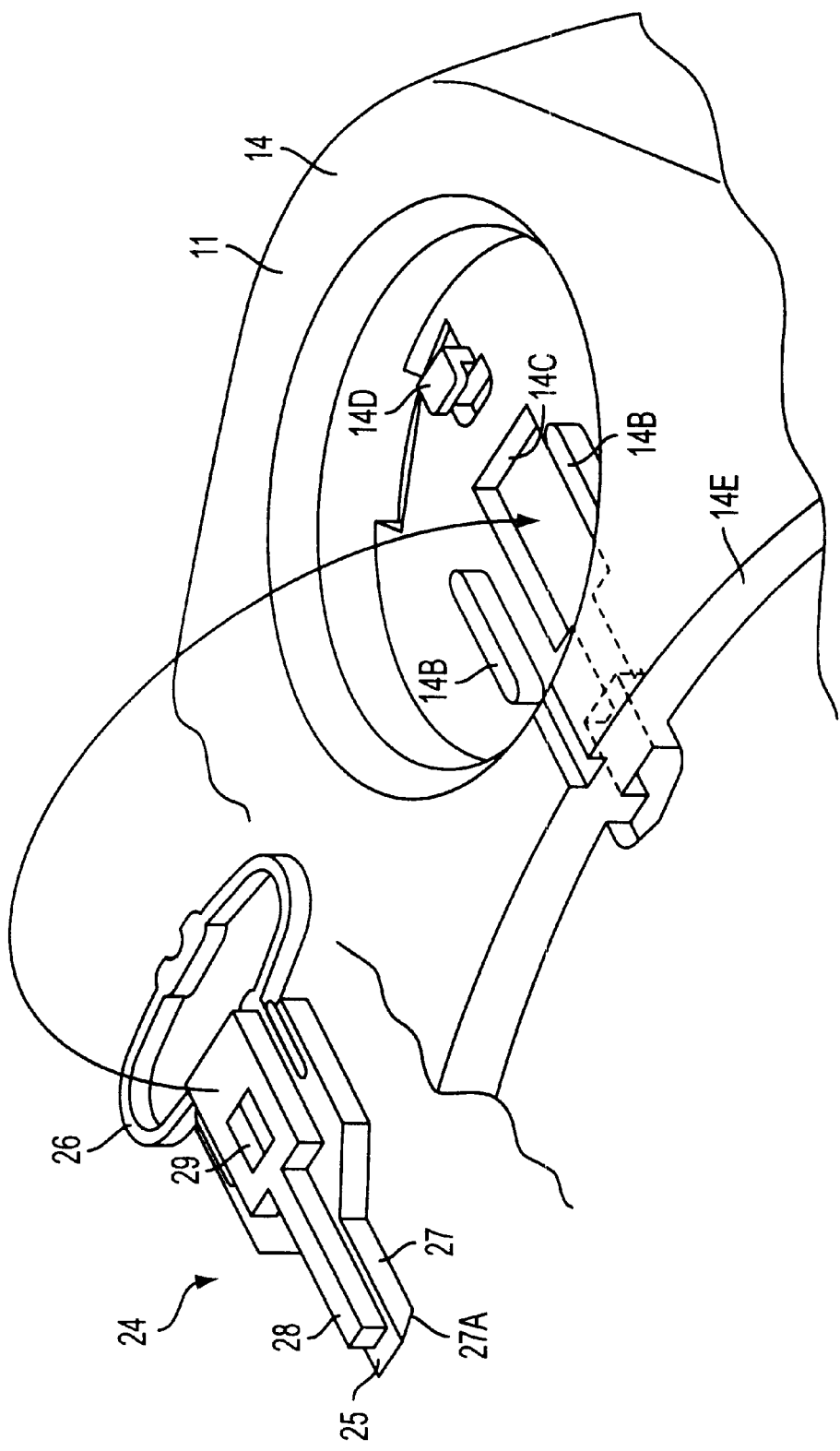
FIG. 7 is an exploded perspective view showing the attachment of the engaging member with a portion of the cabinet.

As shown in FIG. 4, open-close button 16 includes a pressing member 23, which is exposed to the outside and adapted to be pressed by a user, and engaging member 24, which is positioned on upper case main body 14 below pressing member 23. Pressing member 23 has pressing part 23A, whose cross-section is preferably in the shape of a squared-off "C" and which is a flat round shape, and contact part 23B, which is formed roughly in the middle on the engaging member 24 side of this pressing part 23A, whose tip comes into contact with said engaging member 24, and whose side surface is of rectangular shape.

As shown in FIGS. 4–7, engaging member 24 advances and retracts (arrow A in FIG. 4) with respect to engagement piece 21B of disk covering unit 21; and holds cover 13 in a closed state by engaging engagement piece 21B; and has engaging part main body 25, which engages engagement piece 21B, and impelling means 26, which impels engaging part main body 25 in the advance-and-retract direction; and is preferably constituted as an integral molding of injection-molded polyacetal. Engaging part main body 25 comprises a flat protruding-shaped main body upper part 27, which is exposed to the outside when pressing member 23 is removed, and a flat protruding-shaped main body lower part 28, which is formed on the lower side of this main body upper part 27 and is a little smaller than said main body upper part 27. Main body upper part 27 fits snugly between a pair of guides 14B formed in upper case main body 14, thus regulating the movement of engaging member 24 perpendicular to the advance-and-retract direction. Formed on the tip of main body upper part 27 is sloping surface 27A, which slopes downward toward the middle of disk mounting part 20 (see FIG. 4). The tip of sloping surface 27A protrudes into disk mounting part 20 when button 16 is not being pressed downwardly and when impelled toward disk mounting part 20 by impelling means 26. In this way, cover 13 can be held in the closed state by engaging tip 27A in recess 21C of engagement piece 21B. Main body lower part 28 fits snugly into opening 14C (FIG. 7), which is formed in upper case main body 14 and is roughly the same as the flat shape of said main body lower part 28, in this way also regulating the movement of engaging member 24 perpendicular to the advance-and-retract direction. Formed approximately in the middle of main body upper and lower parts 27 and 28 respectively is flat square-shaped through-hole 29. Among the inside surfaces that form through-hole 29, together with being perpendicular to the longitudinal direction of engaging part main body 25, the inside surface formed on the impelling means 26 side is sloping surface 29A, which slopes toward disk mounting part 20. Contact part 23B of aforesaid pressing member 23 makes contact with this sloping surface 29A (FIG. 4). Thus when the operator presses pressing member 23, sloping surface 29A is pressed by contact part 23B, and by the pressing force that acts on this sloping surface 29A, engaging member 24 moves in a direction away from engagement piece 21B. In other words, the pressing force caused by pressing member 23 is converted by sloping surface 29A into a force in the advance-and-retract direction of engaging member 24, thereby allowing engaging member 24 to be separated from engagement piece 21B.

Impelling means 26 is formed in ring shape in plan view, and is formed and positioned so as to be mutually symmetrical with respect to the centerline along the longitudinal direction of engaging member 24. One end of impelling means 26 facing engaging part main body 25 comes into contact with receiving part 14D, which is formed in upper case main body 14 and has an L-shaped cross-section. In this way, impelling means 26 maintains the prescribed elastic force between engaging part main body 25 and receiving part 14D. When the operator removes his hand from pressing part 23A or closes cover 13, engaging member 24 is automatically restored to its original position by impelling means 26, thus making it possible to automatically engage cover 13 by engaging member 24. Engaging member 24 fits main body lower part 28 snugly into opening 14C in a state in which the part that comes into contact with receiving part 14D of impelling means 26 is bent, and after it is fitted in, upper case main body 14 can be attached by releasing the bend of impelling means 26 and engaging said impelling means 26 into receiving part 14D.

The operation of opening and closing cover 13 of such an entertainment device 1 is as follows.

First, when cover 13 is closed (FIGS. 2 and 4), that is, if the tip 27A of main body upper part 27 is engaged in recess 21C of engagement piece 21B, then when the operator presses member 23, contact part 23B of pressing member 23 is inserted into through-hole 29 of engaging part main body 25 and presses against sloping surface 29A. The pressing force applied by contact part 23B against 29A causes engaging member 24 to move in the direction away from engagement piece 21B. In this way, the tip 27A of main body upper part 27 comes away from engagement piece 21B, and cover 13 is released by the elastic force of spring 14A (FIG. 3).

When the operator releases his hand from pressing part 23A, the pressing force on sloping surface 29A disappears, and the impelling force of impelling means 26 causes engaging part main body 25 to move toward disk mounting part 20, and engaging member 24 returns to its original position.

If cover 13 is closed after optical disk 4 is mounted on disk mounting part 20, when said cover 13 is pressed toward disk mounting part 20, the lower surface of engagement piece 21B presses sloping surface 27A of the tip of main body upper part 27, and engaging member 24 moves away from engagement piece 21B. In addition, by pressing cover 13 toward disk mounting part 20, engaging member 24, which had moved away from engagement piece 21B, moves toward recess 21C of engagement piece 21B, and the tip of main body upper part 27 engages with said engagement piece 21B. In this way, cover 13 can be closed.

Thus, because engaging part main body 25 and impelling means 26 are integrated, engaging part main body 25 and the impelling means 26 can be attached just by fitting engaging member 24 onto upper case main body 14, which simplifies the assembly operation of the electronic device cabinet of the invention. In addition, because impelling means 26 is constituted symmetrically about the engaging member 24, the impelling force in the advance-and-retract direction can be made to act on engaging member 24 uniformly left and right. In addition, the structure of impelling means 26 can be simplified by constituting it in a ring shape.

Moreover, because formed on upper case main body 14 is guide 14B that regulates the movement of engaging part main body 25 along the advance-and-retract direction and is positioned perpendicular to the advance-and-retract direction of engaging member 24, engaging member 24 can be mounted along guide 14B, which further simplifies the assembly operation of the cabinet of the invention.

And since engaging member 24 is preferably made of polyacetal, because polyacetal is a good sliding material and has good fatigue resistance, one can slide engaging part main body 25 smoothly along upper case main body 14 and maintain the impelling force of impelling means 26 for a long time.

In addition, because depression 14F is provided on the circumferential edge of opening 14E of upper case main body 14, after cover 13 is attached to upper case main body 14, when doing a confirmation that said cover 13 is attached, etc., it is simple to open and close said cover 13 by latching a finger onto the circumferential edge of cover 13 that is exposed in depression 14F. This makes it easy to confirm attachment of cover 13, etc. Furthermore, because depression 14F is provided on the circumferential edge 14E of upper case main body 14 and is dimensioned such that the base of the depression 14F is aligned with or below the height of an inserted optical disk 4 (see FIG. 3), access to an inserted optical disk, and in particular the edge of such a disk, for removal or the like can be made easier.

And because insertion hole 18A is formed straddling the boundary part of upper case main body 14 and lower case 12, it suffices to form in each of upper case main body 14 and lower case 12 an opening in which one side is missing, which eliminates the former need for a slide core. This can reduce the number of manufacturing steps and increase the productivity of upper case 11 and lower case 12.

This invention is not limited to the aforesaid embodiment but includes other compositions, modifications, etc. including, but not limited to the following.

For example, the material of the engaging member is not limited to polyacetal; one may also use a thermoplastic resin such as, for example, nylon or polycarbonate. Other appropriate materials may also be used.

In the above embodiment, while a guide is formed on the main body for guiding the movement of the engagement member, such a guide may not be necessary if, for example, the lower part of the main body of the engaging member is press-fit into an opening and there is no movement at all of engaging member 24 perpendicular to the advance-and-retract direction.

Moreover, while in the aforesaid embodiment the impelling means is formed in the shape of a ring, it could also be formed in the shape of a spiral or wave. Other shapes are also contemplated.

Also, while in the aforesaid embodiment it is preferred that the impelling means is positioned symmetrically with respect to the engagement member in the advance and retreat direction, it could also be constituted asymmetrically if desired.

In addition, while depression 14F is preferably provided on the circumferential edge of opening 14E, it need not be present if, for example, the cover can be opened and closed simply by latching with a claw, etc.

While the present invention has been described at some length and with some particularity with respect to the several described embodiments, it is not intended that it should be limited to any such particulars or embodiments or any particular embodiment, but it is to be construed with references to the appended claims so as to provide the broadest possible interpretation of such claims in view of the prior art and, therefore, to effectively encompass the intended scope of the invention.

I claim:

1. An electronic device cabinet comprising:
    a) a cabinet main body,
    b) a cover having a circumferential edge, a first end that is rotatably attached to said cabinet main body between an open position and a closed position and a second end that attaches to and releases from said cabinet main body,
    c) a biasing force attached to said cover for biased said cover toward the open position, and
    d) an engaging member provided on said cabinet main body that advances and retracts with respect to the second end of said cover and holds said cover in a closed state,
    e) wherein said engaging member further comprises an engaging part main body that engages the second end of said cover and an impelling means that impels said engaging part main body toward and away from said second end of said cover, said engaging part main body and said impelling means being formed integrally, and
    f) wherein said engaging member is detachable from said cabinet main body through a resilient movement of said impelling means.

2. An electronic device cabinet in accordance with claim 1, wherein said engaging member advances and retracts with respect to said second end of said cover along a sliding plane, and wherein said impelling means is constructed symmetrically about said sliding plane.

3. An electronic device cabinet in accordance with claim 2, wherein said impelling means is ring shaped.

4. An electronic device cabinet in accordance with claims 2 or 3, limber comprising a guide for controlling the movement of said engaging part main body along the sliding plane.

5. An electronic device cabinet in accordance with claim 1, wherein said engaging member is formed from injection-molded polyacetal.

6. An electronic device cabinet in accordance with claim 1, wherein said cabinet main body has an opening into which said cover fits and said opening further comprises a circumferential edge having a depression outside of which the circumferential edge of said cover is exposed when said cover is in the closed position.

7. An electronic device cabinet in accordance with claim 6, wherein said depression thither comprises a lowest point dimension, said lowest point being dimensioned for lateral access to an edge or underside of an optical disk inserted into said cabinet for easy access to an edge or underside of an inserted optical disk.

8. An electronic device cabinet in accordance with claim 7, wherein said lower point extends to or slightly below the edge of an inserted optical disk.

9. An electronic device cabinet in accordance with claim 1, wherein said cabinet main body further comprises a pair of cabinet main body halves joined along a boundary and an opening part that exposes connection terminals for an external device connection, wherein said opening part straddles the boundary of said cabinet main body halves.

10. An electronic device for housing electronic components, comprising:
   a) a cabinet having a cabinet main body,
   b) a cover having a circumferential edge, a first end that is rotatably attached to said cabinet main body between an open position and a closed position and a second end that attaches to and releases from said cabinet main body,
   c) a biasing force attached to said cover for biased said cover toward the open position, and
   d) an engaging member provided on said cabinet main body that advances and retracts with respect to the second end of said cover and holds said cover in a closed state,
   e) wherein said engaging member further comprises an engaging part main body that engages the second end of said cover and an impelling means that impels said engaging part main body toward and away from said second end of said cover, said engaging part main body and said impelling means being formed integrally, and
   f) wherein said engaging member is detachable from said cabinet main body through a resilient movement of said impelling means.

11. An electronic device in accordance with claim 10, wherein said engaging member advances and retracts with respect to said second end of said cover along a sliding plane, and wherein said impelling means is constructed symmetrically about said sliding plane.

12. An electronic device in accordance with claim 11, wherein said impelling means is ring shaped.

13. An electronic device in accordance with claim 11, further comprising a guide for controlling the movement of said engaging part main body along the sliding plane.

14. An electronic device in accordance with claim 10, wherein said engaging member is formed from injection-molded polyacetal.

15. An electronic device in accordance with claim 10, wherein said cabinet main body has an opening into which said cover fits and said opening further comprises a circumferential edge having a depression outside of which the circumferential edge of said cover is exposed when said cover is in the closed position.

16. An electronic device in accordance with claim 15, wherein said depression further comprises a lowest point dimension, said lowest point being dimensioned for lateral access to an edge or underside of an optical disk inserted into said cabinet for easy access to an edge or underside of an inserted optical disk.

17. An electronic device in accordance with claim 16, wherein said lower point extends to or slightly below the edge of an inserted optical disk.

18. An electronic device in accordance with claim 10, wherein said cabinet main body further comprises a pair of cabinet main body halves joined along a boundary and an opening part that exposes connection terminals for an external device connection, wherein said opening part straddles the boundary of said cabinet main body halves.

19. An electronic device cabinet comprising:
   a) a cabinet main body,
   b) a cover having a circumferential edge, a first end that is rotatably attached to said cabinet main body between an open position and a closed position and a second end that attaches to and releases from said cabinet main body,
   c) a biasing force attached to said cover for biased said cover toward the open position, and
   d) an engaging member provided on said cabinet main body that advances and retracts with respect to the second end of said cover and holds said cover in a closed state,
   e) wherein said engaging member further comprises an engaging part main body that engages the second end of said cover and an impelling means that impels said engaging part main body toward and away from said second end of said cover, said engaging part main body and said impelling means being formed integrally, and
   f) wherein said engaging member further comprises a sloping surface that translates a pressing force along a first direction upon said engaging member into a movement of said engaging part main body along a second direction.

20. An electronic device cabinet in accordance with claim 19, wherein said first and second directions are perpendicular to each other.

21. An electronic device for housing electronic components, comprising;
   a) a cabinet having a cabinet main body,
   b) a cover having a circumferential edge, a first end that is rotatably attached to said cabinet main body between an open position and a closed position and a second end that attaches to and releases from said cabinet main body,
   c) a biasing force attached to said cover for biased said cover toward the open position, and
   d) an engaging member provided on said cabinet main body that advances and retracts with respect to the second end of said cover and holds said cover in a closed state,
   e) wherein said engaging member further comprises an engaging part main body that engages the second end of said cover and an impelling means chat impels said engaging part main body toward and away from said second end of said cover, said engaging part main body and said impelling means being formed integrally, and
   f) wherein said engaging member further comprises a sloping surface that translates a pressing force along a first direction upon said engaging member into a movement of said engaging part main body along a second direction.

22. An electronic device in accordance with claim 21, wherein said first and second directions are perpendicular to each other.

* * * * *